United States Patent [19]

Hill

[11] Patent Number: 4,925,705
[45] Date of Patent: May 15, 1990

[54] METHOD OF PRINTING LAYERS HAVING SUBSTANTIALLY EXACT REGISTRATION

[75] Inventor: George R. Hill, Stockport, England

[73] Assignee: Contra Vision Limited, England

[21] Appl. No.: 945,849

[22] Filed: Dec. 23, 1986

[30] Foreign Application Priority Data

Dec. 24, 1985 [GB] United Kingdom ............... 8531804

[51] Int. Cl.⁵ .......................... B05D 3/10; B05D 3/12; B05D 5/00; B05D 1/32
[52] U.S. Cl. ...................................... 427/259; 427/96; 427/264; 427/265; 427/266
[58] Field of Search ................. 427/259, 272, 264, 96, 427/270, 265, 266, 282, 273; 101/129, 115; 156/655

[56] References Cited

U.S. PATENT DOCUMENTS

| | | | |
|---|---|---|---|
| 1,845,016 | 2/1932 | D'Atri | 427/282 X |
| 2,728,693 | 12/1955 | Cado | 427/273 X |
| 3,589,284 | 6/1971 | Harwell, Jr. | 101/115 X |
| 4,242,401 | 12/1980 | Mitani et al. | 427/265 X |
| 4,278,022 | 7/1981 | Fitzpatrick et al. | 427/282 X |
| 4,497,848 | 2/1985 | Baran | 427/106 |

OTHER PUBLICATIONS

Adams, J. M. et al., *Printing Technology*, 3rd edition, Albany, N.Y., Delmar Publishers Inc., 1988, p. 435.

*Primary Examiner*—Evan Lawrence
*Attorney, Agent, or Firm*—Fiddler & Levine

[57] ABSTRACT

A method of printing a number of superimposed or otherwise geometrically related layers on a substrate with exact registration which comprises printing said layers over one or more areas on said substrate so as to overlap the boundary of said one or more areas and then removing the layers outside said areas. The product produced by the method and the intermediate product prior to removal of layers outside the areas can be used for security purposes.

16 Claims, 7 Drawing Sheets

METHOD OF PRINTING LAYERS HAVING SUBSTANTIALLY EXACT REGISTRATION

This invention relates to printing and more particularly to producing a plurality of superimposed layers or a plurality of elements of different inks with substantially exact registration.

In several industries, particularly the electronics industry, the inability of existing printing methods to achieve exact registration causes difficulties in manufacturing products, both from functional and visual points of view. Furthermore, the lack of register of existing printing methods increases with the area being printed.

In the printing of printed circuit boards, there is a common need to superimpose successive layers of ink to the same pattern. In order to achieve the same electrical properties on small area boards, the overall thicknesses of ink deposits are generally required to be thicker. Successive layers of the same ink may be required to achieve the desired overall thickness for the required conductivity, insulation or other property of the element in question, because there are limitations to the thickness of a single layer of ink and the continuity of ink deposit that can be guaranteed in any one application. If the successive layers are not in good register, several problems can result. One of these problems is the requirement for more area of printed circuit board than would otherwise be required, to ensure the necessary separation between the finished elements of a printed circuit board. Another problem is that if successive deposits are not in good register, an individual layer may not be properly deposited, as the thickness of ink build-up underneath will result in a change of level onto which the ink is being deposited, which can cause defects in the initial product which may be apparent immediately or may cause the product to be unreliable in service.

In the printing of membrane switches and membrane keyboards for electric products, there are similar requirements for printing successive layers of ink in exact or near exact registration as identified for printed circuit boards. Additionally, there is a requirement for the printing of membrane switches and membrane keyboards and many other related products, such as instrument panels, dashboards, control panels, appliance display panels, console covers and any rear lit display panels or other illuminated panels, to print successive layers of ink to achieve the required ink density for visual reasons, particularly if there is to be rear illumination of any type, to achieve the desired opacity, transparency or translucency or colour consistency of the individual elements of a design. The required colour density may vary from element to element on a product to suit the location of point light sources for example to give an impression of uniform colour density when illuminated. This may require having different numbers of layers of the same ink or different inks, from element to element. Lack of register in superimposed layers results in indistinct edges to those elements being printed, which can be either aesthetically unsatisfactory or practically unsatisfactory, for example by making letter or numeric characters appear unfocussed or otherwise more difficult to read.

Additionally there is a need to print alternating types of ink, superimposed in the same pattern, for example in a printed circuit board assembly, such as alternating layers or multiple layers of conducting and insulating ink, in order to maintain electrical separation between layers or multiple layers.

In many applications within and outside the electronics industry, there is a need to print additional layers of a required shape to achieve the required visual effect. For example, it is normally required to print fluorescent inks and many other coloured inks on a white background, for them to be effective or achieve the desired colour rendering and this applies particularly to certain substrates, such as glass. For example, to achieve the required colour rendering and opacity of a printed product, it may be necessary to print a required pattern in layers of black, white, then the required colour, all, preferably, in exact registration.

Additionally, there is a need in several industries, particularly the electronics industry, to print different elements of an exact or near exact pattern with an exact or near exact geometric relationship with respect to each other. If these elements are of a different colour, material or thickness, they will normally have to be printed at different times, for example with different screen printing screens and separate "squeegee" operations, an additional problem of registration to that of direct superimposition.

According to the invention there is provided a method of producing printed superimposed or otherwise geometrically related layers with substantially exact registration in one or more predetermined areas comprising successively printing one or more of said layers to extend beyond the boundaries of said area or areas and removing printed material outside the boundaries of said area or areas.

The invention also includes products produced by the method just defined.

There are three principal means of enabling the removal of the unwanted material and many methods of removal of the unwanted material.

One means enabling the removal of the unwanted material is to print or otherwise deposit a mask layer of the required pattern on a substrate. In this context, a mask is to be understood to mean a stencil or negative pattern of the required pattern. The required layers of ink or other material are then applied. The mask layer is subsequently removed along with the unwanted ink or other material. Alternatively, the unwanted ink or other material is first removed and then the mask removed or the mask retained, as so desired. There are many ways of removing such unwanted ink or other materials and removing the mask, if required.

A second means enabling the removal of the unwanted material is to first print on a substrate or partially processed substrate the required pattern in a single layer. Subsequent layers are then printed or otherwise deposited, these layers adhering well to the first printed layer but not to the surface on which this first layer was deposited. The unwanted ink or other material is subsequently removed by virtue of lack of adhesion to the surface which was first printed. There are many methods of removing the unwanted ink or other material.

A third means enabling the removal of the unwanted material is to apply to a substrate all the required ink or other material and any additional ink or material that is not required in the finished product but is necessary or desirable to apply initially to overcome the limitations of registration in the method or methods of printing or other means of application being used. Then a "resist" layer of the required shape or adaptation of the required shape is printed or oherwise applied such that the required shape is achieved in subsequent processing. The resist layer may be part of the finished product or be subsequently removed, for example by a solvent.

It is possible to combine two or more of the above methods if desired.

In all the above methods, a substrate may be taken to mean a material on which the printing is carried out, whether this is part of the eventual product or a temporary carrier. The substrate may be a single material, such as polycarbonate, or may be a composite material or a combination of different materials and may be part-processed by uniform surface treatment, or by previous specialised treatment such as previous printed processes.

Some of the methods of removing unwanted ink or other material are as follows:

(a) Pulling away the unwanted ink or other material by vacuum or suction or adhesive or magnetic force or other means. Examples include the application and removal of self-adhesive film or causing the printed surface to contact adhesive on a roller or other element which removes the unwanted ink or other material.

If self-adhesive material is used to remove ink, the resultant self-adhesive material plus ink can form the principal product rather than be waste or form a secondary product, such as a security audit device. For example a product partially covered by ink with the remaining area covered by self-adhesive can be so produced and can be directly applied to a product and the printed material will be protected by the self-adhesive carrier, without the need for a separate process of applying adhesive to the printed surface, which is normally the case.

(b) Abraiding, cutting or otherwise mechanically removing the unwanted ink or other material such as by cutting and stripping or by pressure hosing.

(c) Causing a mask layer to be expanded, thus bursting off ink thereabove, for example by the application of heat or other expansive agent, such as a liquid which permeates through the layers of ink, or by degrading a mask, for example by being subject to ultraviolet light from the other side of the substrate, or by virtue of the mask layer being compressible for example by being of only partially cured UV ink, or otherwise causing the material above it to be removable by water hosing or other means.

(d) Etching away the unwanted material with a solvent. Combinations of methods (a) to (d) may be used if desired.

There are also many products which can benefit from the ability to print different types of ink or different colours of ink with exact registration. For example, the printing on glass doors of ovens is normally of black colour, to achieve the correct perception of the food being cooked, but can be advantageously printed black with white, silver or other reflective material or colour on the reverse side, to minimise loss of heat or other rays. Similarly, it would be advantageous for many applications to print in two different materials or colours with exact registration, when printing over light covers or shades, for example the rear tail gate assemblies of vehicle lights or conventional electric light shades, to maximise on the internal reflection or other desirable benefits of an alternative material or colour, in order to minimise the size of light source and energy usage of such assemblies.

Additionally it is advantageous to print on to the reverse side of a bright or reflective image, the same pattern in black, or other dark colour, in order to more readily absorb heat or other rays, for example to prevent or reduce condensation by increasing the temperature of the printed product.

Additionally, there are many advantages in the security printing industry in printing patterns with the described methods of achieving substantially exact registration. Because substantially exact registration is difficult to achieve, it is inherently difficult to forge. Also, the methods of production can also form part of a security device, in that the removal of unwanted ink can form an intrinsic part of the process of unsealing a security device. The invention can be used to create or assist in the effectiveness of security printing, tamper evident seals, tamper detectable seals, non-transferable seals, protected graphics. For example, if a printed security pattern consists of one or more inks, on an opaque surface or forms a continuous opaque pattern, it is relatively easy to forge by overprinting or application of an overlay material such as self-adhesive tape, which itself may be printed or otherwise processed to achieve the desired effect. However, if the substrate or a protecting material is transparent and the security pattern produced by means of the invention is discontinuous, it is relatively easy to identify attempted forgery by virtue of ink overlap being visible from one or both sides or by measurement or overlay.

The invention provides one or more of the following fourteen improvements in security products.

(i) Reproduction forgeries are more difficult to print and are relatively easily identified, particularly if successive layers of ink are incorporated and attempted forgeries are seen to exhibit overlap rather than exact superimposition, or the specified geometrical relationships between elements are found to be inaccurate by measurement or overlay. The described invention may form only one part of a security device such as an identification or credit card.

(ii) Alteration forgeries to patterns are much more difficult to effect, particularly if printed elements contain a plurality of ink layers, any lack of registration being easily recognised.

(iii) If the substrate is transparent and any protecting seal is transparent, such that the printing can be viewed from both sides, additional advantages are to be gained.

(iv) Further advantages result if ink is selectively applied, leaving a proportion of the substrate uncovered by ink, to enable scrutiny of the edges of individual elements, particularly if these are multi-layer.

(v) If such edges to elements can be viewed from both sides, additional ease in detecting forgery or alteration is achieved, as any overlap is easily detectable.

(vi) Further advantages are to be gained if the process of ink removal, inherent in the invention, forms part of an unsealing process, such as the unsealing of a container, lottery ticket, a protected identification number, etc. For example, the removal of a self-adhesive transparent tape, container flap or other such device with adhered ink, leaving a pattern of substantially exact registration, normally of a different pattern from that visible when sealed, and the seal bearing a pattern of removed ink, forms a very effective sealing device. The altered pattern is clearly visible and identifiable and has the security advantages of substantially exact registration.

(vii) The seal can be retained for audit purposes and the pattern on the seal can have the benefits of exact registration printing.

(viii) Rupture of the ink and the natural or deliberately devised distortion of the tape makes attempted replacement of the sealing device immediately obvious.

(ix) The designs visible when sealed or unsealed can be predetermined and capable of being compared with a standard or may be deliberately random to further minimise the possibility of forgery but incorporating security features of exact registration printing such as elements consisting of a plurality of ink layers.

(x) If either or preferably both the items being sealed and the seal were transparent, and the ink only selectively remaining after unsealing thereby leaving transparent areas, resealing by a replacement seal would be impossible without easy detection because exact or near exact alignment of opaque ink elements would be impossible, between the ink remaining and the different ink visible on the original seal or any forged replacement seal.

(xi) Additional benefit is obtained if the printing before and after unsealing incorporates features of exact registration printing, in that checks can be carried out at both times and a double audit device is made possible by removal of ink prior to sealing, for example onto self-adhesive tape and, when unsealing, onto the seal.

(xii) If transparent materials were used that could not be repolished for example PVC or polyester or polycarbonate and ink was etched into the surface of the item being sealed, mechanical or chemical removal of the remaining ink would destroy the optical clarity which would be easily identifiable in a resealed product.

(xiii) Removal of a proportion of ink by mechanical, solvent or other means can reveal other information, which is either visible on the object initially or subsequently by removal of the ink. For example, if layers of ink of different material or colour are superimposed, the composition of those layers can be made to be not readily identifiable from either side, if placed on an opaque, translucent or transparent object. Particular layers of ink can mask part or all of other particular layers of ink and methods of printing with exact registration can be used so that only the top layer on one or both sides of a product is readily visible, albeit that these outside layers can cover a succession of ink materials and colours of different ink deposit thickness. It is possible initially or subsequently to remove a proportion of the ink, for example by a scribe of a given angle, that will then reveal the succession of ink materials which will then be readily visible, particularly with the aid of a magnifying glass or the like. The succession of ink layers will be visible as lines, which may be of different materials, colours and thicknesses, within an area much smaller than would be required by normal printing methods to print the same number of lines of different materials, colour and thickness. Such codes could be used to identify details of manufacture, date, ownership or other information and the identification could be readily visible on the product or by removing the ink in a prescribed fashion when it was required to ascertain the information. It has been assessed that the human eye can differentiate between over one million colours and the information storage capability of the invention on a small multilayer element, for example a 1 mm square, using normal printing machines, makes many millions of variations possible. The relevant printed elements can be covered by a protective film, such as a lacquer, whether the exposure of layers is made initially or intended to act as the breaking of a seal, to protect the ink and make any attempt to alter the appearance readily identifiable.

(xiv) A further advantage of the invention is that one of the methods of enabling ink removal can be used to enable the varnishing of paper or card cartons whilst enabling ink or adhesive to penetrate unvarnished areas for durability or security purposes, for example tamper visible seals that often are required to have 95% minimum torn paper or card as an indication of lift off of a sealing tape or flap. Such tearing of paper is not generally possible from above a varnished layer but if the varnish is selectively printed in the form of a mask then adhesive and, if required, one or a plurality of ink types can be applied overlapping the varnished area, the unwanted adhesive or ink being then removed, if so required.

As an example application of some of the above security advantages, the opportunities for improvement in lottery tickets and related games will be considered. At present, such tickets may comprise a card onto which a number or other information is printed on the basis of which prizes are given. The numbered information is commonly covered with scratch-removable ink, which acts as a seal device, and the ticket may be separately contained in an envelope or other enclosure, which provides a protection to the scratch-removable ink until it is required to be removed deliberately. Such tickets are currently liable to forgery by those within the distribution network by gaining access to the ticket through opening and subsequently resealing the envelope, which is relatively easy to carry out undetected. The scratch-removable ink can be removed, the value of the ticket established and, if not of value, replacement removable ink can be relatively easily applied. Separately, those within the distribution system, or customers, can remove the scratch-removable ink, overprint the information and reprint information required, covering this with scratch-removable ink. Such identified or altered tickets can then be used to claim prize money. Using the benefits of the invention, the seal of such a ticket may be self-adhesive tape, which itself may be printed with other information, such as the rules of the game or other components of the game. When removed, this self-adhesive removes a proportion of the ink on the card as part of the exact registration printing process. The information on the card is thus created at the time of unsealing. If the revealed information includes discrete elements of different colour of pre-defined geometrical relationships, then the checking of tickets submitted as winning tickets is made much easier by looking for overlapping inks or incorrect geometrical relationships, for example by means of an overlay. The unsealing self-adhesive material can be made to be self-deforming upon removal which will make subsequent re-application impossible and it will be impossible to prepare a new self-adhesive seal that could not be established to be previously tampered with, either (a) immediately, if the card is of transparent material over a proportion of its area, as printed and sold or after the unsealing process, or (b) subsequently, if both the ticket and seal are opaque, if it is suspected that they have been tampered with. This can be identified from the hidden ruptured ink and a new adhesive or new adhered interface between layers of ink, between ink and ticket, or between ink and seal.

By the above measures, an enclosing protected envelope is rendered unneccessary and it will be beyond the capability of normal printing methods to create a forgery of a complete ticket or an alteration of part of a ticket without being readily obvious.

Specific embodiments of the invention will now be described by way of example with reference to the accompanying drawings in which.

In the various embodiments shown in the drawings like parts have been given the same reference numerals.

In describing the figures, the term "ink" is to be understood to mean any ink, paint or other material which can be deposited on a substrate.

Figure 1A:
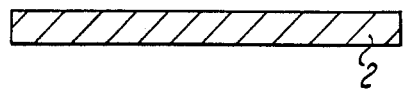
FIGS. 1A to 1G are sections on the line X—X of FIG. 1H showing successive stages in one method of the invention.
Figure 1B:
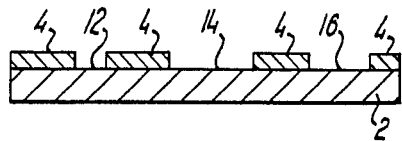
Figure 1C:
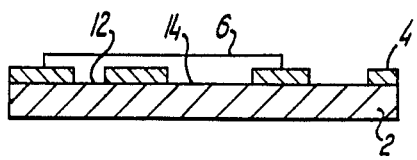
Figure 1D:
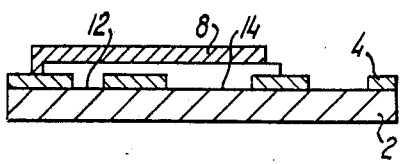
Figure 1E:
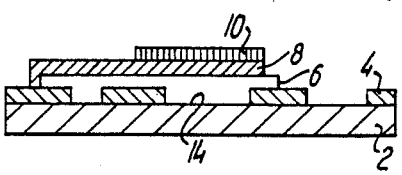
Figure 1F:
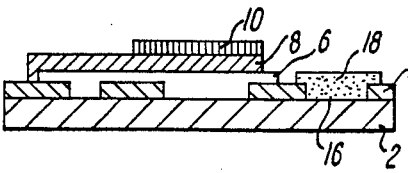
Figure 1G:
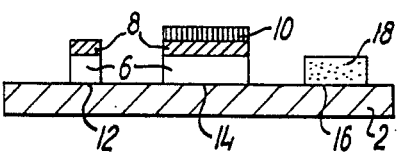
Figure 1H:
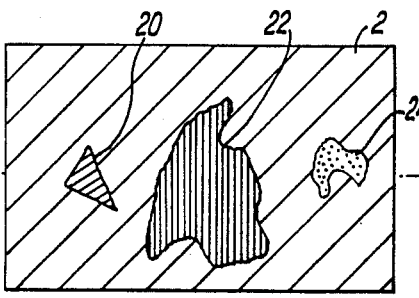
FIG. 1H is a plan view of the product produced by the method steps illustrated in FIGS. 1A to 1G.

Referring first to FIGS. 1A to 1H which show a method of enabling the removal of the unwanted material using a mask material, FIG. 1A illustrates a substrate material 2 onto which printed matter is to be deposited. In FIG. 1B, mask material 4 is printed or otherwise deposited onto the surface of the substrate 2, leaving areas 12, 14 and 16 uncovered, being the shapes required in the final printed design on the substrate, in their required geometric relationships. FIG. 1C illustrates a layer 6 of ink having been applied over the substrate and mask and overlapping the required finished design areas 12 and 14. FIG. 1D illustrates the application of a further ink layer 8 and FIG. 1E illustrates another ink layer 10 overlapping shape 14 only. In FIG. 1F another ink layer 18 is applied which overlaps shape 16 only. FIG. 1G illustrates shapes 12, 14 and 16 having thereabove two, three and one layers of ink respectively, in substantially exact registration, which has been achieved by the removal of the mask 4 and the ink immediately above it, for example by one of the said methods (a), (b) or (c). This removal process may be carried out in one stage or the areas of the ink 6, 8, 10 and 18 above the mask 4 may first be removed and then the mask 4 itself removed or the mask 4 left in place if it does not affect the performance of the finished product; for example the mask could be a transparent release solution. FIG. 1H shows the product in plan with substrate 2 having elements 20, 22 and 24 of the required shapes and geometrical relationships and ink layers.

Figure 2A:
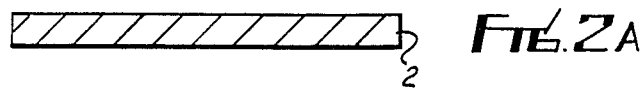
FIGS. 2A to 2G are sections on the line Y—Y of FIG. 2H showing successive stages in another embodiment of the invention.
Figure 2B:
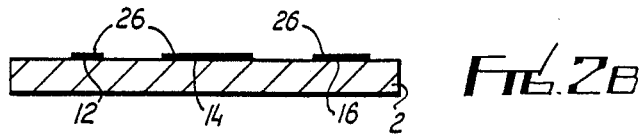
Figure 2C:
Figure 2D:
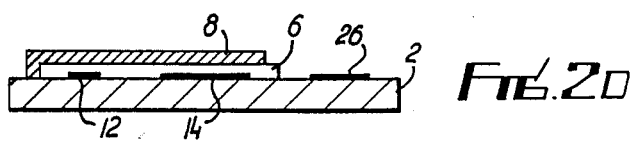
Figure 2E:
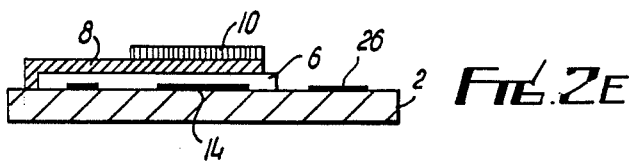
Figure 2F:
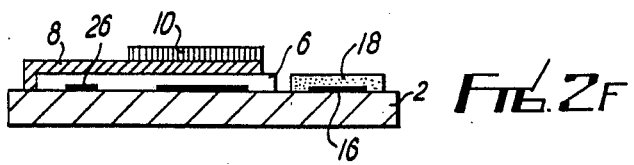
Figure 2G:
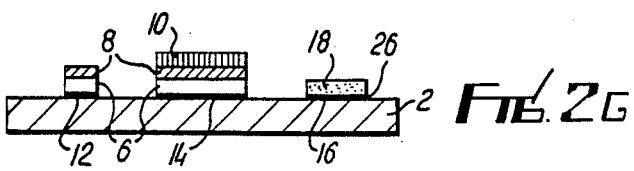
Figure 2H:
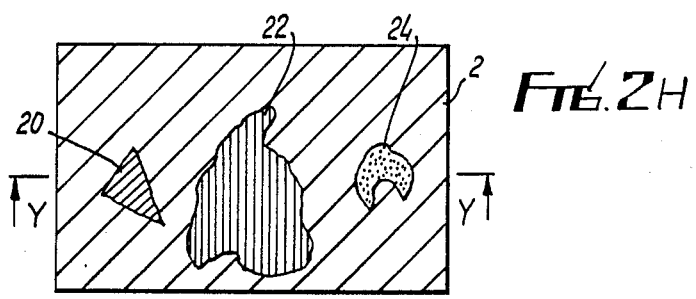
FIG. 2H is a plan view of the product produced by the method steps illustrated in FIGS. 2A to 2G.

FIGS. 2A to 2H illustrate the method of enabling the removal of the unwanted material using a first ink which adheres well to the substrate, subsequent inks generally adhering well to the first ink but not to the substrate. FIG. 2A shows a substrate material 2 onto which printed matter is to be deposited. In FIG. 2B a first ink or other material 26 is first printed or otherwise deposited onto the substrate 2. This first ink or other material 26 adheres well to the substrate 2 and accurately defines areas 12, 14 and 16 that are the shapes required in the final printed design on the substrate, in their required geometric relationships. FIG. 2C illustrates a layer 6 of ink overlapping the required finished design areas 12 and 14. This ink 6 adheres well to ink 26 but does not adhere well to the substrate 2. All subsequent layers of ink that come into direct contact with the substrate also adhere well to the ink below but do not adhere well to the substrate. Any subsequent layers that do not come into direct contact with the substrate only need to have good adhesion with the ink below and need not have poor adhesion to the substrate. FIG. 2D illustrates a further ink layer 8 overlapping shapes 12 and 14 and FIG. 2E illustrates another ink layer 10 applied to overlap shape 14 only. In FIG. 2F another ink layer 18 overlaps shape 16 only. FIG. 2G illustrates shapes 12, 14 and 16 having two, three and one layers of ink respectively, all on top of the first layer of ink 26, in substantially exact registration. This has been achieved by the removal of the ink overlapping the required design shapes 12, 14 and 16, for example, by one of the said methods (a), (b) or (c). FIG. 2H shows the product in plan with substrate 2 having elements 20, 22 and 24 of the required shapes and geometrical relationships and ink layers.

Figure 3A:
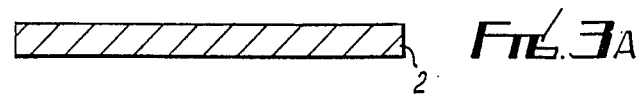
FIGS. 3A to 3G are sections on the line Z—Z of FIG. 3H showing successive stages of a further embodiment of the invention.
Figure 3B:
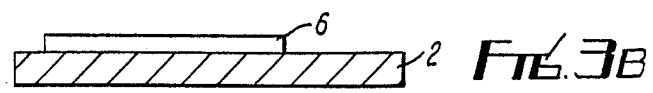
Figure 3C:
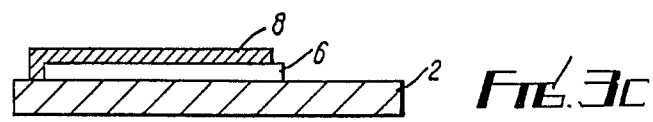
Figure 3D:
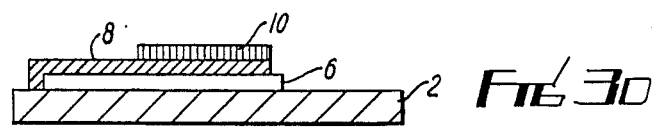
Figure 3E:
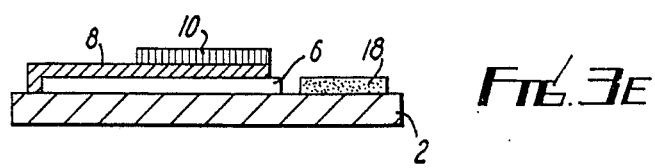
Figure 3F:
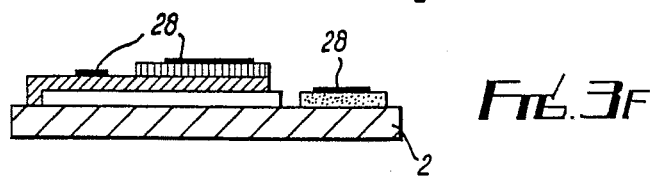
Figure 3G:
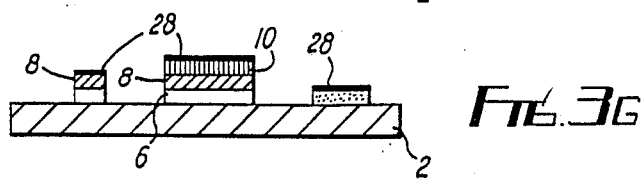
Figure 3H:
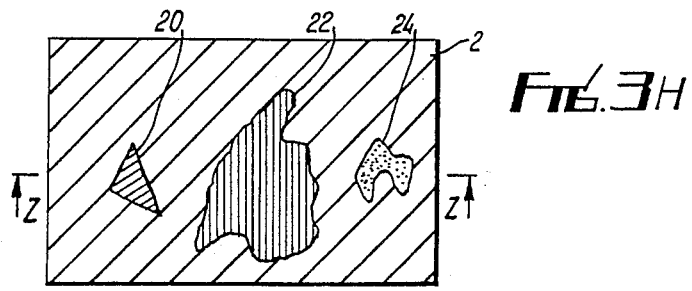
FIG. 3H is a plan view of the product produced by the method steps illustrated in FIGS. 3A to 3G.

FIGS. 3A to 3H show the method of enabling the removal of the unwanted material by the use of a resist ink to define the required shapes and their geometrical relationship. A solvent is then used to etch away inks around the resist ink. FIG. 3A illustrates a substrate material 2 onto which printed matter is to be deposited. FIGS. 3B–E illustrate the application of successive ink layers 6, 8, 10 and 18. FIG. 3F illustrates the application of resist ink 28 which accurately defines the shapes required in the final printed design, in their required geometrical relationships. FIG. 3G shows the unwanted ink material removed by a solvent to which ink 28 is resistant. FIG. 3H illustrates a plan of the substrate 2 having elements 20, 22 and 24 of the required shapes and geometrical relationships and ink layers.

It can be seen that the methods outlined in FIGS. 1, 2 and 3 can be used to create virtually any number of shapes, in any desired geometrical relationships, each of one or more layers, each of one or more differing types of ink, with substantially exact registration all over an printable area of substrate.

As will be evident from the description of the embodiment of FIGS. 4A to 4D, if the ink 26 in FIG. 2 were transparent or the substrate 2 opaque and the ink 28 in FIG. 3 were transparent or removed from the final product, then all three methods of enabling the removal of unwanted material could achieve the same visual impression from either side of the finished product.

The elements produced can be of any printable shape or size. They need not be discrete but may be abutted or overlapped and each layer of ink need not be continuous across the whole of an element. For example layer 10 in FIGS. 1, 2 and 3 can be printed characters seen against layer 8.

Figure 4A:
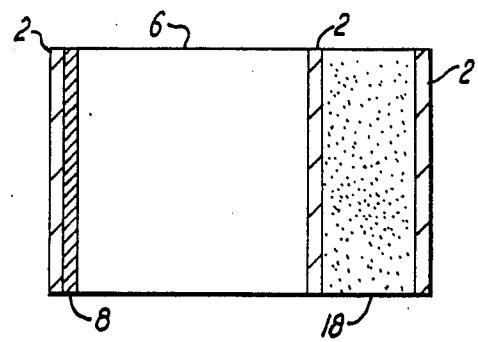
FIG. 4A is an underplan view of a product prior to removal of unwanted ink.
Figure 4B:
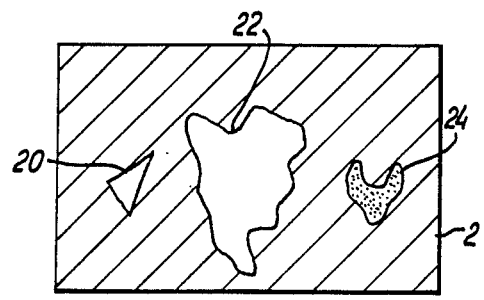
FIG. 4B is an underplan view of the product of FIG. 4A after removal of unwanted ink.
Figure 4C:
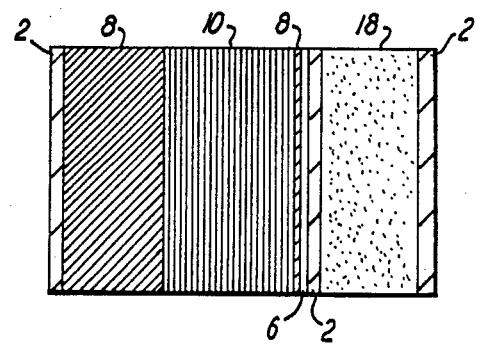
FIG. 4C is plan view of the product of FIG. 4A.
Figure 4D:
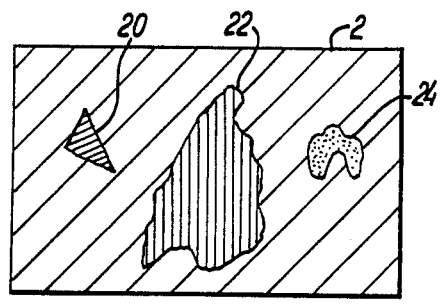
FIG. 4D is a plan view of the product of FIG. 4B.

FIGS. 4A and 4B are both viewed from the unprinted side of a transparent substrate 2. FIG. 4A illustrates possible shapes of deposited ink 6, 8 and 18 that would be visible through the transparent substrate. FIG. 4B illustrates elements 20, 22 and 24 after removal of the unwanted material. FIGS. 4C and 4D are both viewed from the printed side of the transparent substrate 2. FIG. 4C illustrates the possible shapes of deposited inks 8, 10 and 18 that would be visible. FIG. 4D illustrates elements 20, 22 and 24 after removal of the unwanted material.

Figure 5A:
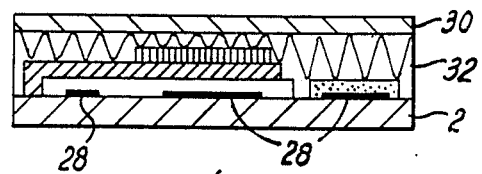
FIGS. 5A and 5B illustrate removal of unwanted ink.
Figure 5B:
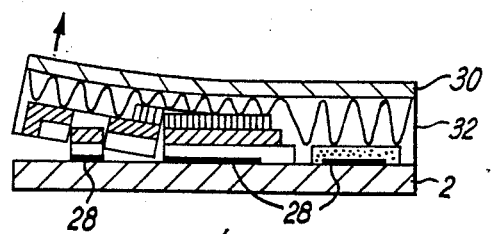

FIG. 5 illustrates one way of removal of unwanted ink within said method (a). FIG. 5A illustrates self-adhesive material applied to the product at the stage illustrated in FIG. 2F, a film material 30 acting as a carrier for the adhesive 32. FIG. 5B illustrates the unwanted ink being pulled away from the substrate 2 by the carrier 30 and adhesive 32. FIG. 5 may be a non-transferable tamper evident security device in which carrier 30 is a protective seal which, when removed, revealed a recognisable design as illustrated in FIG. 2H, this design having the security feature of being printed with substantially exact registration.

The design may be informative, for example the word "tampered" or a number which would be in substantially exact registration and capable of being checked against a standard and could be of multi-layer elements, which would additionally cause forgery or alteration to be extremely difficult. Such features could not be seen from the outer surface of carrier 30, which might appear to be just normal self-adhesive material, printed or otherwise, covering the exact registration printing device below. If either or both of the substrate 2 or the protective layer 30 were transparent, initial printed information could be changed to other information upon removal of the protective layer 30, the adhesive 32 and the adhered ink.

FIG. 6 illustrates a security sealing device which takes advantage of the substantially exact registration features before and after breaking the seal. FIG. 6A is a product produced by one of the three methods described by reference to FIGS. 1, 2 or 3, illustrating the means of enabling the removal of unwanted ink to achieve a design with substantially exact registration. Inks 34, 36, 38 and 40 are of different colour. 42 represents a line of relative weakness between the layers of ink, created, for example, by a relatively weak ink or by the bond between ink 38 and the inks below being relatively weak compared to the bond between inks 34, 36 and 40 and the bond between inks, 34 and 40 to the substrate 2. In FIG. 6B this assembly is applied to a product 44 by means of adhesive 32. If either or both substrate 2 and product 44 is transparent, and adhesive 32 is transparent, then the seal can be checked when in use by being of the known design with exact registration. Any attempted forgery not produced by one of the described techniques would exhibit lack of registration between superimposed layers visible to the naked eye and the geometrical relationships between individual elements could be checked against a standard, by use of an appropriate measuring device, overlay or the like. FIG. 6C illustrates the seal having been broken by substrate 2 being pulled away from product 44, the separation taking place at the line of relative weakness 42, revealing a different design on the product 44, which for simplicity has been shown as of single colour ink 38 but could, of course, be multi-coloured.

A different design is visible on the inside face of substrate 2, which itself might perform a security function, for example if broken seals are retained and audited.

By virtue of ink and adhesive rupture and distortion of substrate 2 upon removal, it is impossible to replace the seal on the product 44 without it being visually obvious providing either or both the substrate 2 and the product 4 are transparent. It would be impossible to manufacture a replacement seal to align the elements of the design with substantially exact registration to the ink remaining on the product. The distortion of the substrate 2 can be accentuated by using a relatively weak, extendable, substrate material 2 or deliberately inserting areas of weakness in the substrate 2 for example by punching lines of holes therein.

Figure 6A:
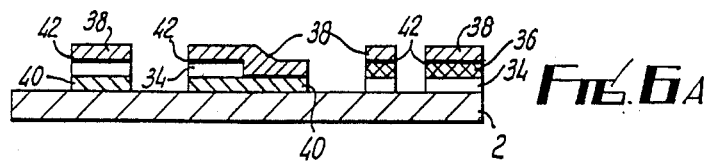
FIGS. 6A to 6D illustrate the application of the invention to a security seal.
Figure 6B:
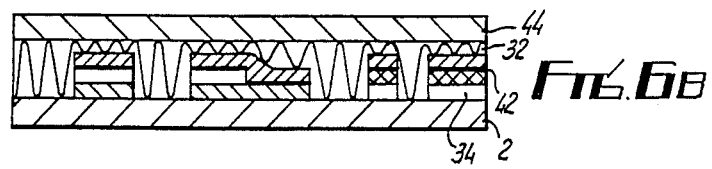
Figure 6C:
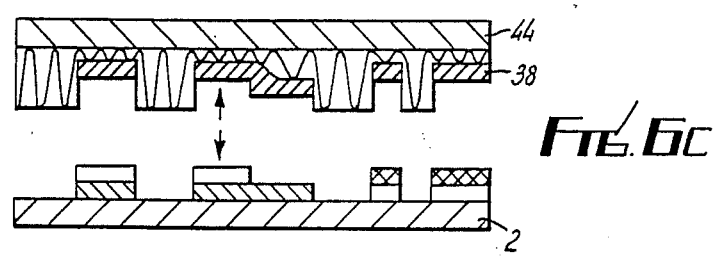
Figure 6D:
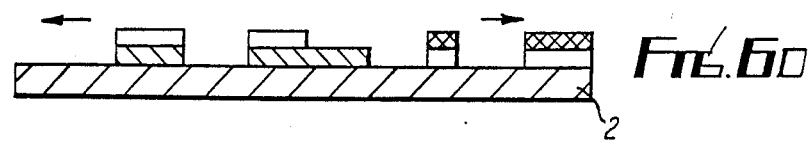

FIG. 6D represents a substrate 2 which has distorted in the direction of the arrows upon removal from the product, making realignment of the elements of the pattern impossible.

It should be understood that this arrangement and description relate to only one of many possible arrangements using the invention of methods of exact registration printing to achieve security devices such as seals. For example, if the product is directly printed using one of the described methods, the product is represented by 2 in FIG. 6, whereas 44 and 32 represent a transparent self-adhesive seal. In this configuration the ink remaining on the product is directly adhered to the product and may be arranged to be etched into the product, making total removal of evidence of the seal more difficult.

Figure 7A:
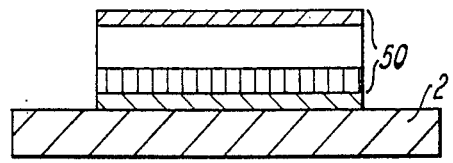
FIG. 7A is a section through a part of a multilayer printed element.
Figure 7B:
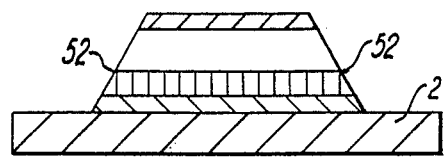
FIGS. 7B and 7C are security assemblies formed from the element of FIG. 7A.
Figure 7C:
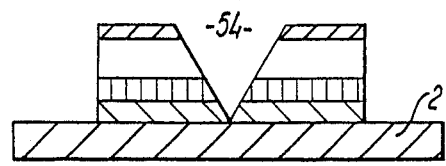
Figure 7D:
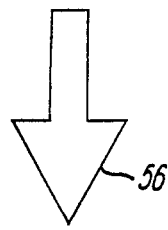
FIG. 7D is a plan view of a tool for forming the assemblies of FIGS. 7B and 7C.

FIG. 7A illustrates in section a part of a multi-layer element produced by one of the previously described methods of printing with exact registration. The element comprises a plurality of ink layers 50 on a substrate 2. By scribing the edges of the multiple layers 50 at an angle as referenced 52 in FIG. 7B the succession of ink layers becomes visible when viewed from above. The same effect can be achieved as shown in FIG. 7C by cutting out a wedge shaped section 54 from the multiple layers. FIG. 7D illustrates a scribing tool that can be used to form the embodiments of FIGS. 7B and 7C.

I claim:

1. A method of producing superimposed layers with substantially exact registration in one or more areas on a substrate, said method comprising the steps of: placing a mask on the substrate, said mask defining said one or more areas; successively printing one or more of said layers on the substrate to extend beyond the boundaries of said one or more areas defined by the mask; leaving the mask in place during the entire time that the layers are applied; and removing the unwanted parts of the layers of printed material outside the boundaries of said one or more areas only after all the layers have been applied.

2. A method as claimed in claim 1, wherein the mask is removed together with the removing of the unwanted parts of the layers outside said areas printed thereon.

3. A method as claimed in claim 1, wherein the mask is removed subsequent to--; the removal of the unwanted parts of the layers outside said areas.

4. A method as claimed in claim 1, wherein the mask is left in place while the--; unwanted parts of the layers outside said areas are removed.

5. A method as claimed in claim 1, wherein the first layer is printed on the substrate in said one or more areas and wherein second and/or subsequent layers have greater adhesion to said first layer than to said substrate.

6. A method as claimed in claim 1, wherein a resist layer which defines the said one or more areas is placed over said layers and the unwanted parts of the layers outside said one or more areas left exposed by the resist layer are removed.

7. A method as claimed in claim 6, wherein the resist layer is removed after removal of the said unwanted parts of the layers.

8. A method as claimed in claim 1, wherein the removal of the said unwanted parts of the layers outside said one or more areas comprises pulling away said unwanted layer parts from the substrate.

9. A method as claimed in claim 8, wherein said unwanted layer parts are pulled away by a surface which adheres to the unwanted parts.

10. A method as claimed in claim 9, wherein the unwanted layer parts on said surface form superimposed or otherwise geometrically related layers with substantially exact registration.

11. A method as claimed in claim 1, wherein the removal of the said unwanted parts of the layers outside said one or more areas comprises mechanical removal.

12. A method of producing superimposed, or otherwise geometrically related, layers with substantially exact registration in one or more areas comprising the steps of successively printing one or more of said layers on a substrate to extend beyond the boundaries of said one or more areas; and removing unwanted printed material outside the boundaries of said one or more areas by expansion of unwanted layer parts and/or of a mask beneath said unwanted layer parts.

13. A method of producing superimposed, or otherwise geometrically related, layers with substantially exact registration in one or more areas comprising the steps of: successively printing one or more of said layers on a substrate to extend beyond the boundaries of said one or more areas; and removing unwanted material outside the boundaries of said one or more areas by applying said unwanted layer parts over a compressible or deformable layer and applying pressure to said unwanted layer parts.

14. A method as claimed in claim 13, wherein said compressible or deformable layer comprises partially cured ultra violet curing ink.

15. A method of producing superimposed, or otherwise geometrically related, layers with substantially exact registration in one or more areas comprising the steps of: successively printing one or more of said layers on a substrate to extend beyond the boundaries of said one or more areas and removing unwanted layer parts of printed material outside the boundaries of said one or more areas by etching.

16. A method of producing superimposed layers with substantially exact registration in one or more areas comprising the steps of: successively printing one or more of said layers on a substrate to extend beyond the boundaries of said one or more areas; removing printed material outside the boundaries of said one or more areas; and cutting at least some of the layers at an angle to the major planes thereof whereby the succession of layers is visible when viewed in a direction substantially normal to the said major planes.

* * * * *

UNITED STATES PATENT AND TRADEMARK OFFICE
CERTIFICATE OF CORRECTION

PATENT NO. : 4,925,705
DATED : May 15, 1990
INVENTOR(S) : George R. Hill

It is certified that error appears in the above-identified patent and that said Letters Patent is hereby corrected as shown below:

In claim 3, line 2, after "to" delete " --; " ;

In claim 4, line 2, after "the" delete " --; " ;

In claim 5, line 2, after "layer" insert --- being a mask --- ;

Delete claims 6 and 7.

Signed and Sealed this

Seventh Day of May, 1991

Attest:

HARRY F. MANBECK, JR.

*Attesting Officer*  *Commissioner of Patents and Trademarks*

REEXAMINATION CERTIFICATE (2479th)

United States Patent [19]
Hill

[11] B1 4,925,705

[45] Certificate Issued Feb. 14, 1995

[54] METHOD OF PRINTING LAYERS HAVING SUBSTANTIALLY EXACT REGISTRATION

[75] Inventor: George R. Hill, Stockport, England

[73] Assignee: Contra Vision Limited, England

Reexamination Request:
No. 90/003,202, Sep. 21, 1993

Reexamination Certificate for:
Patent No.: 4,925,705
Issued: May 15, 1990
Appl. No.: 945,849
Filed: Dec. 23, 1986

Certificate of Correction issued May 7, 1991.

[30] Foreign Application Priority Data

Dec. 24, 1985 [GB] United Kingdom ............... 8531804

[51] Int. Cl.$^6$ .................. B05D 3/10; B05D 3/12; B05D 5/00; B05D 1/32
[52] U.S. Cl. ................... 427/259; 427/96; 427/264; 427/265; 427/266; 427/7

[58] Field of Search ............. 427/7, 96, 259, 264, 427/265, 270, 272, 273, 277, 266, 282; 156/655; 101/129, 115

[56] References Cited

U.S. PATENT DOCUMENTS

| | | | |
|---|---|---|---|
| 1,199,882 | 10/1916 | Frey . | |
| 3,924,728 | 12/1975 | Brown et al. | 427/140 |
| 4,232,059 | 11/1980 | Proffitt | 427/96 |
| 4,401,686 | 8/1983 | Durand | 427/13 |
| 4,420,365 | 12/1983 | Lehrer | 156/643 |
| 4,426,169 | 6/1984 | Hartmann | 400/241.1 |
| 4,673,609 | 6/1987 | Hill | 428/187 |

FOREIGN PATENT DOCUMENTS

2118096  2/1983  United Kingdom .

*Primary Examiner*—Terry J. Owens

[57] ABSTRACT

A method of printing a number of superimposed or otherwise geometrically related layers on a substrate with exact registration which comprises printing said layers over one or more areas on said substrate so as to overlap the boundary of said one or more areas and then removing the layers outside said areas. The product produced by the method and the intermediate product prior to removal of layers outside the areas can be used for security purposes.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 13 and 14 is confirmed.

Claims 6 and 7 were previously cancelled.

Claims 1, 5, 9, 12, 15 and 16 are determined to be patentable as amended.

Claims 2–4, 8, 10 and 11, dependent on an amended claim, are determined to be patentable.

New claims 17 and 18 are added and determined to be patentable.

1. A method of producing superimposed layers with substantially exact registration in one or more areas on a substrate *by removing unwanted parts of the layers*, said method comprising the steps of: placing a mask on the substrate, said mask defining said one or more areas; successively printing one or more of said layers on the substrate to extend beyond the boundaries of said one or more areas defined by the mask, *wherein at least one of said layers covers less than said one or more areas*; leaving the mask in place during the entire time that the layers are applied; and removing the unwanted parts of the layers of printed material outside the boundaries of said one or more areas only after all the layers have been applied.

5. A method [as claimed in claim 1, wherein the first layer being a mask is printed] *of producing superimposed layers with substantially exact registration in one or more areas on a substrate by removing unwanted parts of one or more layers, said method comprising the steps of: printing* on the substrate [in] *a first layer being a mask defining* said one or more areas; and [wherein] *printing a* second [and/or subsequent layers have] *layer consisting of a liquid ink having* greater adhesion to said first layer than to said substrate *to extend in an unbroken layer beyond the boundaries of at least part of one area defined by said first layer; leaving said first layer in place during the entire time that the said second and any subsequent layers are applied; and removing the unwanted parts of said one or more layers of printed material outside the boundaries of said one or more areas only after all the layers have been applied.*

9. A method as claimed in claim [8] *17*, wherein said unwanted layer parts are pulled away by a surface which adheres to the unwanted parts.

12. A method of producing superimposed, or otherwise geometrically related, layers with substantially exact registration in one or more areas *on a substrate by removing unwanted layer parts* comprising the steps of: successively printing one or more of said layers on [a] *said* substrate to extend beyond the boundaries of said one or more areas, *wherein at least one of said layers covers less than said one or more areas*; and removing unwanted printed material outside the boundaries of said one or more areas by expansion of unwanted layer parts and/or of a mask beneath said unwanted layer parts.

15. A method of producing superimposed, or otherwise geometrically related, layers with substantially exact registration in one or more areas *on a substrate by removing unwanted layer parts* comprising the steps of:
successively printing one or more of said layers on [a] *said* substrate to extend beyond the boundaries of said one or more areas, *wherein at least one of said layers covers less than said one or more areas* and removing unwanted layer parts of printed material outside the boundaries of said one or more areas by etching.

16. A method of producing superimposed layers with substantially exact registration in one or more areas comprising the steps of: successively printing one or more of said layers on a substrate to extend beyond the boundaries of said one or more areas; removing printed material outside the boundaries of said one or more areas; and cutting at least some of the layers at an angle to [the major planes thereof] *said substrate* whereby the succession of layers is visible when viewed [in] *from* a direction [substantially] normal to said [major planes] *substrate*.

*17. A method of producing superimposed layers with substantially exact registration in one or more areas on a substrate by removing unwanted parts of the layers with at least one of the layers having an exposed surface, said method comprising the steps of: placing a mask on the substrate, said mask defining said one or more areas; successively printing one or more of said layers on the substrate to extend beyond the boundaries of said one or more areas defined by the mask; leaving the mask in place during the entire time that the layers are applied; and removing the unwanted parts of the layers of printed material outside the boundaries of said one or more areas only after all the layers have been applied; wherein the removal of said unwanted parts of the layers outside said one or more areas comprises pulling away said unwanted parts of the layers from the substrate by a pulling force applied to the exposed surface of said unwanted parts of the layers and at least a part of said one or more areas.*

*18. A method of producing superimposed layers with substantially exact registration in one or more areas on a substrate by removing unwanted parts of the layers, said method comprising the steps of: placing a mask on the substrate, said mask defining said one or more areas; successively printing one or more of said layers on the substrate to extend beyond the boundaries of said one or more areas defined by the mask; leaving the mask in place during the entire time that the layers are applied; and removing the unwanted parts of the layers of printed material outside the boundaries of said one or more areas only after all the layers have been applied, wherein the removal of said unwanted parts of the layers outside said one or more areas comprises mechanical removal by pressure hosing.*

* * * * *